United States Patent
Park

(10) Patent No.: US 9,741,455 B1
(45) Date of Patent: Aug. 22, 2017

(54) SEMICONDUCTOR MEMORY DEVICE AND OPERATING METHOD THEREOF

(71) Applicant: SK hynix Inc., Gyeonggi-do (KR)

(72) Inventor: Mun-Phil Park, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 15/333,928

(22) Filed: Oct. 25, 2016

(30) Foreign Application Priority Data

Jun. 3, 2016 (KR) .................. 10-2016-0069295

(51) Int. Cl.
| | | |
|---|---|---|
| *G11C 29/02* | (2006.01) | |
| *G11C 29/00* | (2006.01) | |
| *G11C 11/406* | (2006.01) | |
| *G11C 11/4096* | (2006.01) | |
| *G11C 11/408* | (2006.01) | |
| *G11C 11/4094* | (2006.01) | |
| *G11C 11/4093* | (2006.01) | |
| *G11C 11/4076* | (2006.01) | |
| *G11C 29/44* | (2006.01) | |

(52) U.S. Cl.
CPC ............ *G11C 29/76* (2013.01); *G11C 11/406* (2013.01); *G11C 11/4076* (2013.01); *G11C 11/4082* (2013.01); *G11C 11/4093* (2013.01); *G11C 11/4094* (2013.01); *G11C 11/4096* (2013.01); *G11C 29/02* (2013.01); *G11C 29/4401* (2013.01)

(58) Field of Classification Search
CPC .............................. G11C 29/02; G11C 29/12
USPC ................................................ 365/200, 201
See application file for complete search history.

(56) References Cited

U.S. PATENT DOCUMENTS

| | | | | |
|---|---|---|---|---|
| 5,386,392 A * | 1/1995 | Cantiant | ................ | G11C 29/32 |
| | | | | 327/292 |
| 6,301,169 B1 * | 10/2001 | Kikuda | ................ | G11C 7/1006 |
| | | | | 365/189.02 |
| 6,650,582 B2 * | 11/2003 | Matsumoto | .......... | G11C 7/1006 |
| | | | | 365/189.03 |
| 6,798,701 B2 * | 9/2004 | Yamazaki | .......... | G11C 29/1201 |
| | | | | 365/189.05 |
| 7,149,944 B2 * | 12/2006 | Okawa | .................... | G11C 29/16 |
| | | | | 714/718 |

(Continued)

FOREIGN PATENT DOCUMENTS

| | | |
|---|---|---|
| KR | 1020130135658 | 12/2013 |
| KR | 1020170044347 | 4/2017 |

*Primary Examiner* — Michael Tran
(74) *Attorney, Agent, or Firm* — IP & T Group LLP

(57) ABSTRACT

A semiconductor memory device includes: a cell array region storing and outputting data selected based on an input address and including a first cell region storing a failure address; an input control signal generator generating a compression signal informing presence of failure cells, and generating an input control signal based on the compression signal; an output control signal generator generating an output control signal in response to the input control signal and a pre-charge signal; a failure address latch storing the input address as the failure address in response to the input control signal, and outputting the failure address based on the output control signal; a failure address mapper mapping the failure address to the data line to store the failure address in the first cell region; and a non-volatile memory device receiving the failure address from the first cell region and programming it in a rupture mode.

20 Claims, 10 Drawing Sheets

(56) References Cited

U.S. PATENT DOCUMENTS

| | | | | |
|---|---|---|---|---|
| 7,903,484 B2* | 3/2011 | Nakamura | ............ | G11C 29/24 |
| | | | | 365/189.07 |
| 8,154,005 B2* | 4/2012 | Hsia | .................. | H01L 27/1021 |
| | | | | 257/5 |
| 8,315,116 B2* | 11/2012 | Kim | .................... | G11C 29/785 |
| | | | | 365/200 |
| 8,472,270 B2* | 6/2013 | Samuels | .............. | G11C 17/16 |
| | | | | 365/201 |
| 8,824,227 B2* | 9/2014 | Kim | ...................... | G11C 29/28 |
| | | | | 365/189.07 |

* cited by examiner

SEMICONDUCTOR MEMORY DEVICE AND OPERATING METHOD THEREOF

CROSS-REFERENCE TO RELATED APPLICATIONS

The present U.S. non-provisional patent application claims priority under 35 U.S.C. §119 to Korean Patent Application No. 10-2016-0069295, filed on Jun. 3, 2016 in the Korean Intellectual Property Office (KIPO), the disclosure of which is incorporated herein by reference in its entirety.

BACKGROUND

1. Field

Exemplary embodiments of the present invention relate to a semiconductor memory device capable of repairing defective memory cells occurring after packaging, and a method of operating the semiconductor memory device.

2. Description of the Related Art

Semiconductor memory devices, such as a Dynamic Random Access Memory (DRAM) device, generally go through a wafer-level test, which is referred to as 'a wafer test' hereafter, and a post-packaging test, which is referred to as 'a package and module test' hereafter, to determine whether there are any defects in the chips, after the semiconductor memory devices are designed and fabricated.

When defective memory cells are detected in a wafer test, the defective memory cells may be replaced with redundant memory cells in the inside of a DRAM device. However, defective memory cells detected in a package and module test cannot be replaced with redundant memory cells and cause chip failure, thus deteriorating the package yield.

In particular, when a DRAM package or module is fabricated, heat energy applied to a DRAM chip may deteriorate the refresh characteristics and cause failure bits. The failure bits may lead to a decreased yield. Generally, the yield drops more as the chips become smaller. To overcome this problem and bring up a tail part of a refresh characteristics graph in which the refresh characteristics appear poor, the wafer test has to be performed more strictly, and the strict wafer test also decreases the yield. To minimize the decrease in the yield, a failure address occurring due to heat after a package or a module is fabricated has to be repaired. However, packages or modules do not have a memory for storing a failure address, hence, there is a limitation in repairing failure bits of a DRAM after a package is fabricated and it takes a long time to perform the test.

SUMMARY

Embodiments of the present invention are directed to a semiconductor memory device capable of repairing defective memory cells that are detected after a packaging stage, and a method of operating the semiconductor memory device.

In accordance with an embodiment of the present invention, a semiconductor memory device includes: a cell array region suitable for storing and outputting a data selected based on an input address, the cell array region including a first cell region suitable for storing a failure address; an input control signal generation unit suitable for generating a compression signal informing whether or not there is a failure cell by reading the data which is received from the cell array region through a data line in response to a read command during a parallel test mode, and for generating an input control signal based on the generated compression signal; an output control signal generation unit suitable for generating an output control signal in response to the input control signal and a pre-charge signal; a failure address latch unit suitable for storing the input address as the failure address in response to the input control signal, and for outputting the stored failure address in response to the output control signal; a failure address mapping unit suitable for mapping the failure address to the data line to store the failure address in the first cell region of the cell array region; and a non-volatile memory device suitable for receiving the failure address from the first cell region and for programming the failure address in a rupture mode.

The cell array region may include a memory cell region for a normal operation, and during the parallel test mode, an active operation of a first word line for driving memory cells of the first cell region may be performed while a pre-charge operation is performed on a second word line for driving the memory cells of the cell array region.

The output control signal generation unit may further generate a word line active signal and a plurality of column selection signals for driving memory cells of the first cell region.

The output control signal generation unit may activate the word line active signal and at least one among the plurality of the column selection signals in response to the pre-charge signal and the input control signal during the parallel test mode, and the output control signal generation unit may activate the word line active signal and sequentially activate the plurality of the column selection signals during the rupture mode.

More than two word lines of the first cell region may be activated in response to the word line active signal.

The output control signal generation unit may include: a first delayer suitable for generating a first delay signal by delaying the pre-charge signal for a first predetermined time; a second delayer suitable for generating a second delay signal by delaying the first delay signal for a second predetermined time; a flag signal generator suitable for generating a failure flag signal which is activated in response to the input control signal and deactivated in response to an active signal; an active signal generator suitable for generating the word line active signal activated in a predetermined duration in response to the pre-charge signal in an active duration of the failure flag signal, and activated in an active duration of a rupture enable signal; a pulse signal generator suitable for generating the output control signal which is activated in response to the first delay signal in the active duration of the failure flag signal; and a selection signal generator suitable for activating at least one of the plurality of the column selection signals in response to the second delay signal in the active duration of the failure flag signal, and for sequentially activating the plurality of the column selection signals in the active duration of the rupture enable signal.

The active duration of the word line active signal may be decided based on the number of word lines in the first cell region that are activated in response to the word line active signal.

The input control signal generation unit may include: a data compressor suitable for generating the compression signal by compressing the data outputted through the data line during the parallel test mode; and a pulse signal generator suitable for generating the input control signal in a pulse form based on the compression signal.

The failure address mapping unit may map the bits of the failure address to a data line allocated to a predetermined bank among a plurality of banks included in the cell array region.

The semiconductor memory device may further include: a rupture diving unit suitable for transferring the failure address received from the first cell region of the cell array region through the data line to the non-volatile memory device in the rupture mode.

In accordance with another embodiment of the present invention, a semiconductor memory device includes: a cell array region including a plurality of banks and a first cell region suitable for storing bank failure addresses, the cell array region being suitable for storing and outputting a data selected based on a command and an input address in and out of the plurality of the banks; a test unit suitable for comparing in a test mode the data received from the plurality of the banks of the cell array region through a first data line and a second data line in response to a read command with each other and for generating a plurality of bank failure flag signals informing whether or not there is a failure cell; an output control signal generation unit suitable for generating an output control signal in response to a refresh signal; a failure address latch unit suitable for storing the input address as the bank failure addresses in response to the plurality of the bank failure flag signals, and for outputting the stored bank failure addresses in response to the output control signal; a failure address mapping unit suitable for mapping the bank failure addresses to the first and second data lines to store the bank failure addresses in the first cell region of the cell array region; and a non-volatile memory device suitable for receiving and programming the bank failure addresses received from the first cell region in a rupture mode.

The test mode is an application test (AT) mode that may be performed by mounting the semiconductor memory device on a product.

The failure address latch unit may include: a plurality of bank failure address latches corresponding to the plurality of the bank failure flag signals, the plurality of the bank failure address latches being suitable for storing the input address as the bank failure addresses in response to the corresponding plurality of the bank failure flag signals, and for simultaneously outputting the stored bank failure addresses in response to the output control signal, respectively.

The output control signal generation unit may further generate a word line active signal and a plurality of column selection signals for driving memory cells of the first cell region.

The output control signal generation unit may activate the word line active signal and at least one among the plurality of the column selection signals in response to the refresh signal during the test mode, and the output control signal generation unit may activate the word line active signal and sequentially activates the plurality of the column selection signals during the rupture mode.

The output control signal generation unit may include: a first delayer suitable for generating a first delay signal by delaying the refresh signal for a first predetermined time; a second delayer suitable for generating a second delay signal by delaying the first delay signal for a second predetermined time; a flag signal generator suitable for generating a failure flag signal which is activated in response to the input control signal and deactivated in response to an active signal; an active signal generator suitable for generating the word line active signal which is activated in a predetermined duration in response to the refresh signal in an active duration of a test mode signal, and activated in an active duration of a rupture enable signal; a pulse signal generator suitable for generating the output control signal which is activated in response to the first delay signal in the active duration of the test mode signal; and a selection signal generator suitable for activating at least one among the plurality of the column selection signals in response to the second delay signal in the active duration of the test mode signal, and for sequentially activating the plurality of the column selection signals in the active duration of the rupture enable signal.

The failure address mapping unit may map bits of the failure address latch unit to the first data line and the second data line.

In accordance with an exemplary embodiment of the present invention, a method of operating a semiconductor memory device may include: providing a memory device including a volatile memory cell array to store and output data selected based on an input address, a latch unit and a non-volatile memory device coupled to the volatile memory cell array, and the volatile memory cell array includes a first region to store a failure address; in a parallel test mode, generating a compression signal to indicate that there is at least one failure cell by reading the data received from a second region adjacent to the first region of the volatile memory cell array through a data line in response to a read command and generating an input control signal based on the compression signal; storing the input address as the failure address in the latch unit in response to the input control signal; mapping the failure address to the data line to store the failure address in the first region of the volatile memory cell array; and in a rupture mode, receiving the failure address from the first region of the volatile memory cell array and programming the failure address to the non-volatile memory device.

The first region of the volatile memory cell array may be disposed with adjacent to the latch unit.

The volatile memory cell array may include a second region for a normal operation, and, when a pre-charge operation is performed on a word line for driving memory cells of the second region, an active operation is performed on a word line for driving memory cells of the first cell region, during the parallel test mode In accordance with yet another embodiment of the present invention, a method of operating a semiconductor memory device for storing and outputting a data selected based on a command and an input address and includes a cell array region provided with a first cell region which stores a failure address, includes: generating a compression signal that informs whether or not there is a failure cell by reading data received from the cell array region through a data line in response to a read command in a parallel test mode, and generating an input control signal based on the generated compression signal; storing the input address as the failure address in a latch unit in response to the input control signal; generating an output control signal in response to a pre-charge signal and the input control signal; outputting the failure address that is stored in the latch unit in response to the output control signal; mapping the failure address to the data line to store the failure address in the first cell region of the cell array region; and receiving the failure address that is received from the first cell region and programming the received failure address in a rupture mode.

The cell array region may include a memory cell region for a normal operation, and, when a pre-charge operation for pre-charging a first word line is performed for driving memory cells of the memory cell region during the parallel test mode, an active operation for activating a second word line is performed for driving memory cells of the first cell region.

In accordance with still another embodiment of the present invention, a method of operating a semiconductor memory device including a plurality of banks storing and outputting a data which is selected based on a command and an input address, and a cell array region provided with a first cell region which stores bank failure addresses, includes, generating a plurality of bank failure flag signals that inform whether or not there is a failure cell in a test mode by comparing the data that are received from the plurality of the banks of the cell array region through a first data line and a second data line with each other in response to a read command; storing the input address as the bank failure addresses in a plurality of laches in response to the plurality of the bank failure flag signals; generating an output control signal in response to a refresh signal; outputting the bank failure addresses that are stored in the plurality of laches in response to the output control signal; mapping the bank failure addresses to the first and second data lines to store the bank failure addresses in the first cell region of the cell array region; and receiving the bank failure addresses that are received from the first cell region of the cell array region and programming the received bank failure addresses in a rupture mode.

The test mode may be an application test (AT) mode that is performed by mounting the semiconductor memory device on a product.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figure 1:
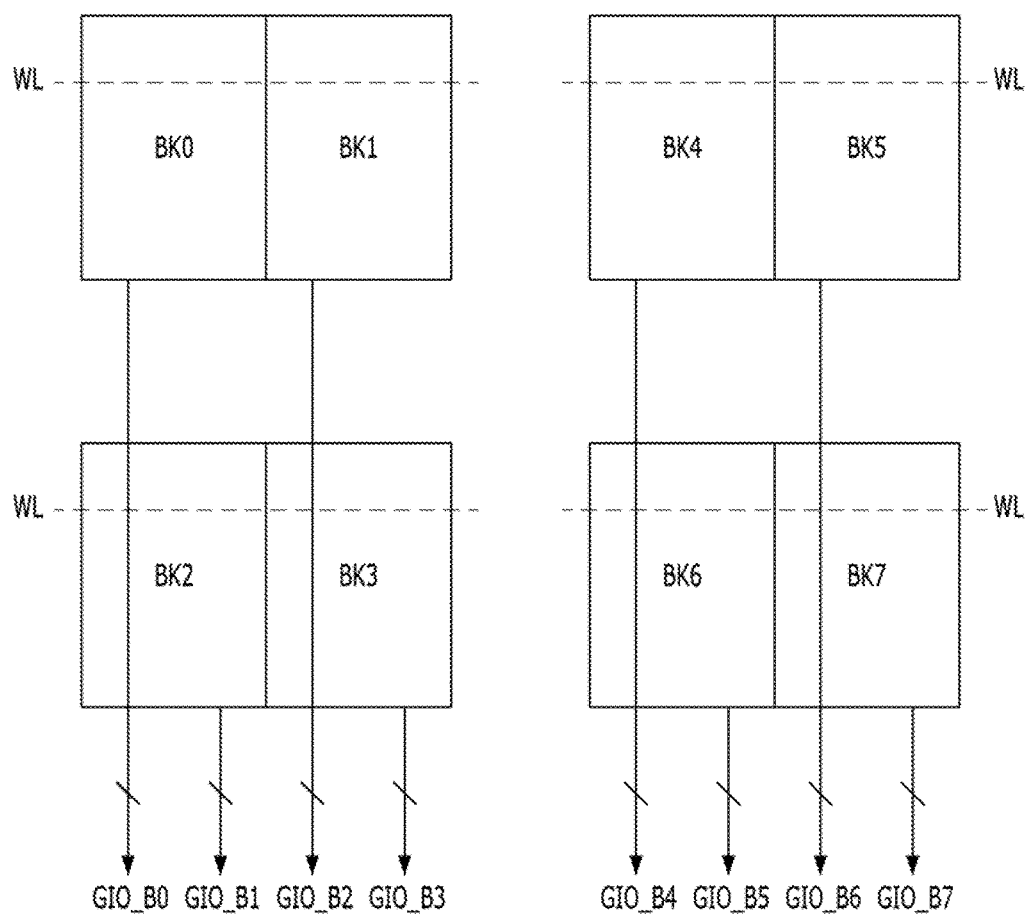
FIG. 1 illustrates a parallel test of a semiconductor memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Generally, a parallel test is performed by writing the same data, e.g., 0 or 1, in a plurality of memory cells during a package and module test, and then outputting the stored data from the plurality of the memory cells. A test performer may decide whether a memory cell is a normal memory cell or a defective memory cell based on the data received from the memory cell among the plurality of the memory cells.

FIG. 1 illustrates a parallel test of a semiconductor memory device.

Referring to FIG. 1, in a parallel test mode, word lines WL of banks BK0 to BK7 are simultaneously activated in response to a word line active signal. The same data is written in memory cells that are coupled to selected word lines, and then the data are read out of the memory cells. Herein, the data is read out through global data input/output lines GIO_B0 to GIO_B7 of the respective banks BK0 to BK7. The read data is inputted to an exclusive OR device, and when the data that is read from the memory cells have the same value, the memory cells are decided as normal memory cells. If there is any different data read out, the memory cell that outputs the different data is decided as a defective memory cell. In this way, the time taken for the test may be reduced.

According to an embodiment of the present invention, defective memory cells requiring repair may be detected based on a parallel test that is performed to reduce the test time during a package and module test.

Hereafter, the features of the present invention will be described with reference to the accompanying drawings. The following embodiments of the present invention will be described focusing on the structures relating to a test operation. Structures relating to a normal operation are not illustrated in the drawings.

Figure 2:
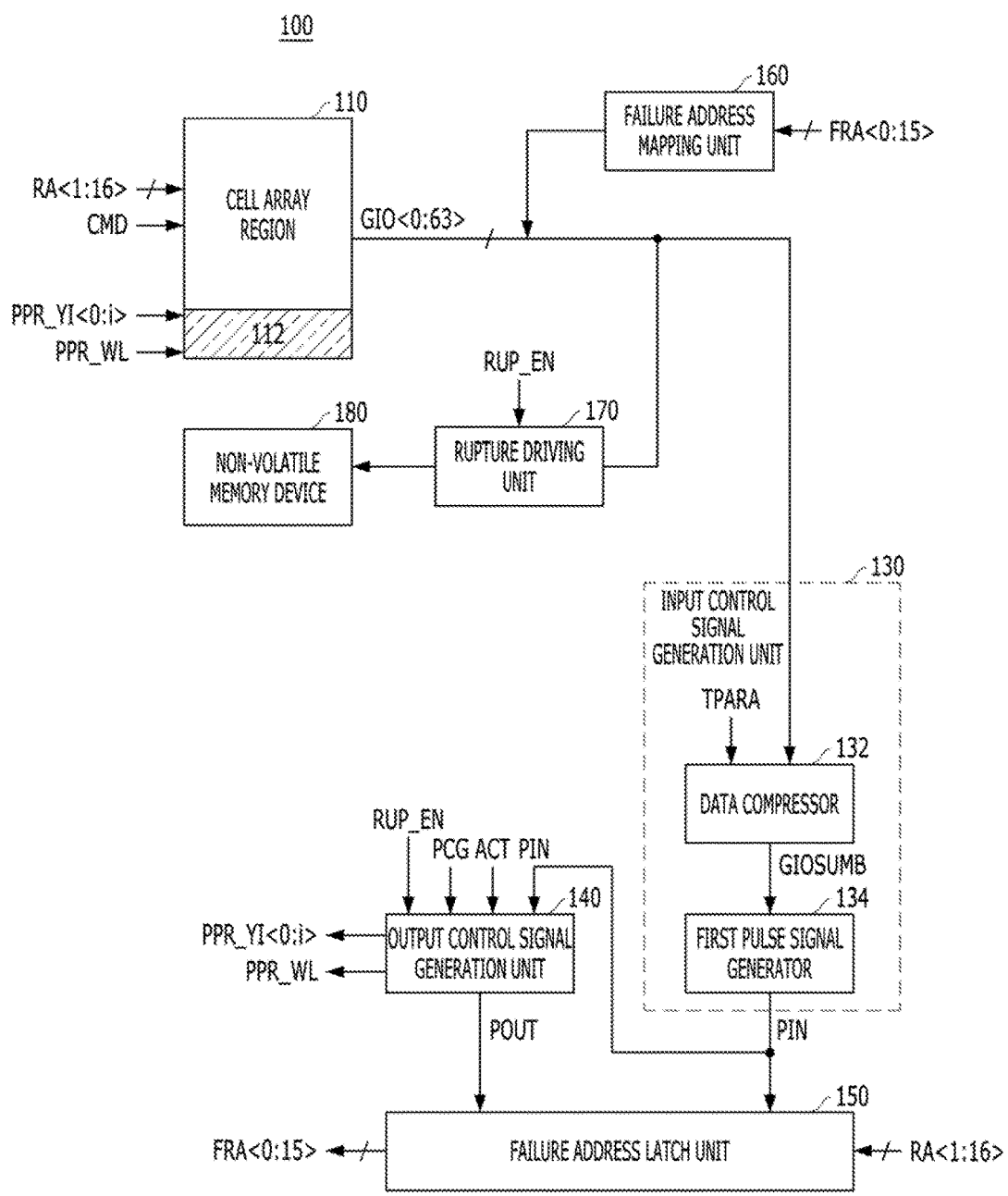
FIG. 2 is a block diagram illustrating a semiconductor memory device, in accordance with an embodiment of the present invention.

FIG. 2 is a block diagram illustrating a semiconductor memory device 100 in accordance with an embodiment of the present invention. As a non-limiting example, a cell array region 110 may be provided with 8 banks B0 to B7 (not shown). The banks B0 to B7 may be coupled to external structures through 64 global data lines GIO<0:63> in FIG. 2.

Referring to FIG. 2, the semiconductor memory device 100 may include the cell array region 110, an input control signal generation unit 130, an output control signal generation unit 140, a failure address latch unit 150, a failure address mapping unit 160, and a non-volatile memory device 180.

The cell array region 110 includes memory cells that store data, and the cell array region 110 may store data in selected memory cells or output the data from the selected memory cells according to a command CMD and an input address RA<1:16> associated with the command CMD. The memory cells are coupled to word lines (not shown) and bit lines (not shown). The cell array region 110 may be formed of a plurality of banks B0 to B7 each of which includes a plurality of cell matrices. The cell array region 110 in accordance with an exemplary embodiment of the present invention may be formed of volatile memory cells. In an embodiment of the present invention, the cell array region 110 may be formed of DRAM memory cells.

According to the embodiment of the present invention, a portion of the cell array region 110 may be allocated as a failure address storing region 112 for storing a failure address FRA<0:15>. For example, the failure address storing region 112 may include memory cells for storing the failure address FRA<0:15>. The failure address storing region 12 may store and output data in and out of memory cells that are selected based on a failure address word line active signal PPR_WL and at least one failure address column selection signal PPR_YI<0:i>.

A portion of the cell array region 110 may be allocated as the failure address storing region 112 for storing the failure addresses FRA<0:15>. The remaining portion of the cell array region 110 may be allocated as a normal memory cell region for storing data during a normal operation. During a parallel test mode, a word line for driving the memory cells of the failure address storing region 112 (which is referred to as 'a failure address storing word line', hereafter) and a word line for driving the memory cells of the normal memory cell region (which is referred to as 'a normal word line', hereafter) may be driven in a way so that they are activated at the same time. For example, during a pre-charge operation of a normal word line, a failure address storing word line performs an active operation. Conversely, when the normal word line performs an active operation, the failure address storing word line may perform a pre-charge operation. Therefore, in accordance with the embodiment of the present invention, when the normal word line and the failure address storing word line are disposed in the same cell matrix sharing a sense amplifier, the normal word line and the failure address storing word line may be used at different times, i.e., not simultaneously. Therefore, it is possible to minimize a circuit that is added for driving the memory cells of the failure address storing region 112 by having a failure address storing word line sharing a sense amplifier with a normal word line.

The memory cells of the failure address storing region 112 may be volatile memory cells, hence, they should be refreshed periodically. In accordance with an embodiment of the present invention, a failure address storing word line and a normal word line may be matched one-on-one and a refresh operation of the failure address storing word line and a refresh operation of the normal word line may be performed concurrently so as to secure reliability of memory cells.

The input control signal generation unit 130 may generate a compression signal GIOSUMB that informs whether or not there is a failure cell by reading data from the cell array region 110 through the global data lines GIO<0:63> in response to a read command RD (included in the command CMD) during the parallel test mode. The input control signal generation unit 130 may also generate a pulse-type input control signal PIN based on the generated compression signal GIOSUMB.

The output control signal generation unit 140 may generate a pulse-type output control signal POUT in response to a pre-charge signal PCG and the pulse-type input control signal PIN received from the first pulse signal generation 134 of the input control signal generation unit 130.

The failure address latch unit 150 may store the input address RA<1:16> as the failure address FRA<0:15> in response to the pulse-type input control signal PIN, and may output the stored failure address FRA<0:15> to the failure address mapping unit 160 in response to the pulse-type output control signal POUT. According to an embodiment of the present invention, the failure address storing region 112 is allocated to a bank disposed adjacent to the failure address latch unit 150 so as to minimize the increase in the area occupied by the failure address storing region 112.

The failure address mapping unit 160 may map the failure address FRA<0:15> received from the failure address latch unit 150 to the global data lines GIO<0:63> so that the failure address FRA<0:15> may be stored in the failure address storing region 112 of the cell array region 110. According to an embodiment of the present invention, the failure address mapping unit 160 may map the bits of the failure address FRA<0:15> to the global data lines that are allocated to predetermined banks among the plurality of the banks included in the cell array region 110. For example, the failure address mapping unit 160 may map the 16 bits of the failure address FRA<0:15> to some global data lines GIO_B0<0, 2, 4, 6>, GIO_B1<0, 2, 4, 6>, GIO_B2<0, 2, 4, 6> and GIO_B3<0, 2, 4, 6> of the global data lines GIO<0: 63> that are allocated to the upper four banks B0 to B3 among the 8 banks B0 to B7 included in the cell array region 110. However, this is a mere non-limiting example. It is noted that the mapping operation of the failure address mapping unit 160 in accordance with may be realized in different ways without departing from the scope of the present invention.

The non-volatile memory device 180 may program the failure address FRA<0:15> that is received from the failure address storing region 112 of the cell array region 110 during a rupture mode. According to an embodiment of the present invention, the non-volatile memory device 180 may be or include an array e-fuse (ARE) circuit, a NAND flash memory, a NOR flash memory, a Magnetic Random Access Memory (MRAM), a Spin-Transfer Torque a Magnetic Random Access Memory (STT-MRAM), a Resistive Random Access Memory (ReRAM), and a Phase-Change Random Access Memory (PRAM).

The semiconductor memory device 100 in accordance with an embodiment of the present invention may further include a rupture driving unit 170. The rupture driving unit 170 transfers information corresponding to the data (which is the failure address FRA<0:15>) received from the failure address storing region 112 of the cell array region 110 through the global data lines GIO<0:63> to the non-volatile memory device 180 in the rupture mode. Herein, when a parallel test signal TPARA is activated, the parallel test mode may begin, and when a rupture enable signal RUP_EN is activated, the rupture mode may begin.

The input control signal generation unit 130 may include a data compressor 132 and a first pulse signal generator 134. The data compressor 132 may generate the compression signal GIOSUMB informing whether or not there is a failure cell by compressing the data received from the cell array region 110 through the global data lines GIO<0:63>. The first pulse signal generator 134 may receive the compression signal GIOSUMB and generate the pulse-type input control signal PIN.

Meanwhile, the output control signal generation unit 140 may further generate the failure address word line active signal PPR_WL and the failure address column selection signals PPR_YI<0:i> for driving the memory cells of the failure address storing region 112.

According to an embodiment of the present invention, the output control signal generation unit 140 may activate the failure address word line active signal PPR_WL and at least one of the failure address column selection signals PPR_YI<0:i> in response to an active signal ACT, the pre-charge signal PCG and the pulse-type input control signal PIN during the parallel test mode. Therefore, the failure address FRA<0:15> received in the failure address mapping unit 160 from the failure address latch unit 150 may be written in the memory cells of the failure address storing region 112 in response to the failure address word line active signal PPR_WL and the activated failure address column selection signal PPR_YI during the parallel test mode. Also, the output control signal generation unit 140 may activate the failure address word line active signal PPR_WL and sequentially activate the failure address column selection signals PPR_YI<0:i> during the rupture mode. Therefore, during the rupture mode, the failure address FRA<0:15> stored in the memory cells of the failure address storing region 112 may be sequentially programmed in the non-volatile memory device 180 through the rupture driving unit 170 in an active duration of the rupture enable signal RUP_EN.

According to an embodiment of the present invention, at least two word lines of the failure address storing region 112 may be simultaneously activated in response to the failure address word line active signal PPR_WL. Therefore, since the active duration of the failure address word line active signal PPR_WL becomes shorter, a write operation for storing the failure address FRA<0:15> in the failure address storing region 112 for an active-pre-charge time tRP may be secured. For example, according to an embodiment of the present invention, four word lines of the failure address storing region 112 may be simultaneously activated in response to the failure address word line active signal PPR_WL. Hence, more than two failure address word line active signals, for example, 4 failure address word line active signal PPR_WL<0:3> may be generated.

As described above, when a failure cell is detected as a result of performing the parallel test during the package and module test in accordance with an exemplary embodiment of the present invention, the failure address FRA<0:15> is stored in the failure address latch unit 150 and then the failure address FRA<0:15> stored in the failure address latch unit 150 is stored in some memory cells of the cell array region 110 in response to the pre-charge signal. Also, the stored failure address FRA<0:15> is programmed in the non-volatile memory device 180 during the rupture mode, and then the failure address FRA<0:15> programmed in the non-volatile memory device 180 is used to repair the failure cells that are detected after the packaging stage, which is called a post-package repair. The post-package repair may improve the yield and reduce the test time.

Figure 3:
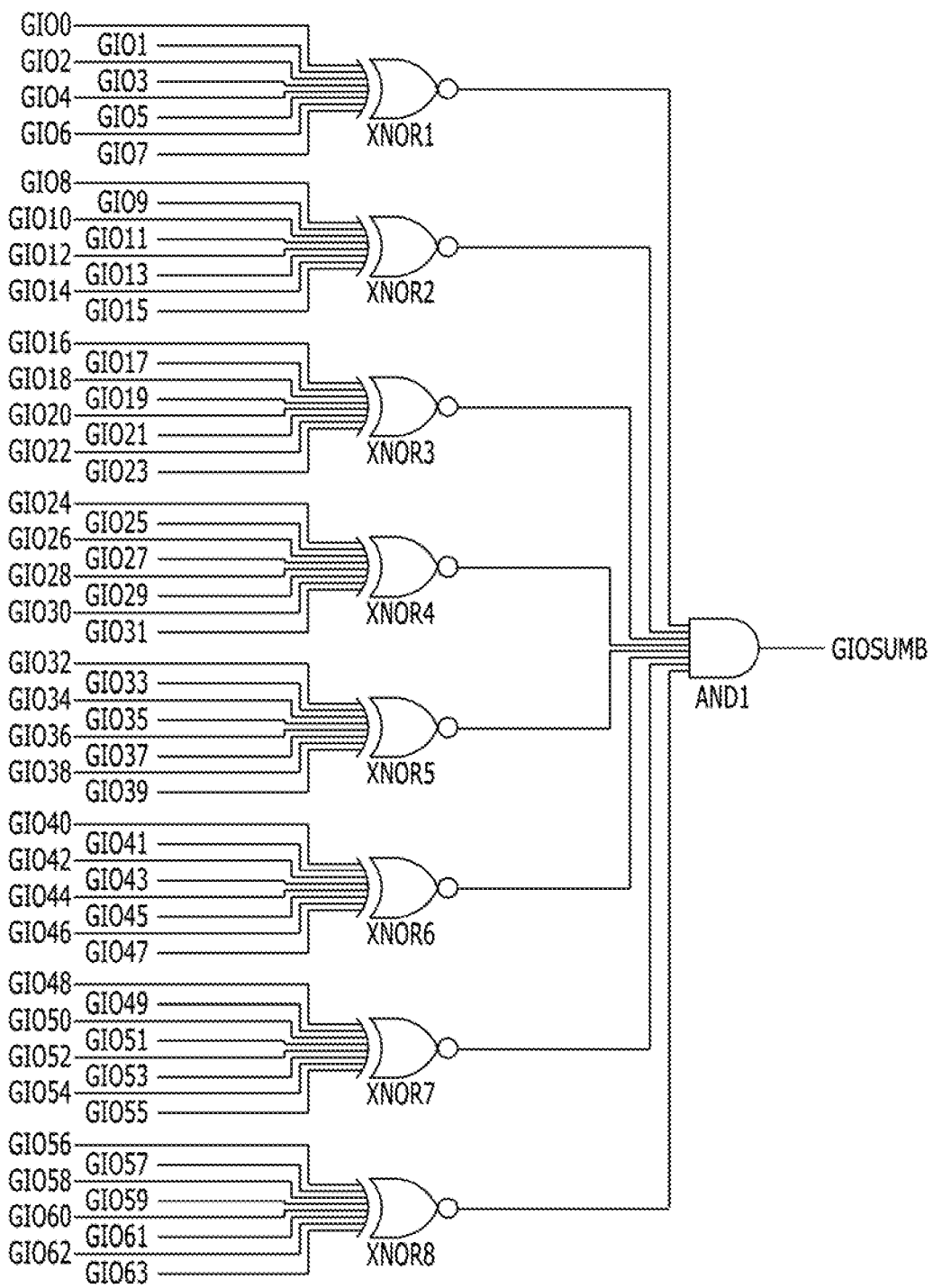
FIG. 3 is a circuit diagram illustrating a data compressor of an input control signal generation unit shown in FIG. 2.

FIG. 3 is a circuit diagram illustrating a configuration example of the data compressor 132 of the input control signal generation unit 130 shown in FIG. 2.

Referring to FIG. 3, the data compressor 132 may include a plurality of exclusive NOR gates XNOR1 to XNOR8 that receive the data transferred to the global data lines GIO<0: 63> on the basis of a predetermined number of the data, and an AND gate AND1 for generating the compression signal GIOSUMB by combining the output signals of the first to eighth exclusive NOR gates XNOR1 to XNOR8. In conclusion, when even one data among the data transferred to the global data lines GIO<0:63> has a different value, the compression signal GIOSUMB has a low level logic, thereby informing that there is a failure cell. On the other hand, when all the data transferred to the global data lines GIO<0:63> have the same value, the generated compression signal GIOSUMB has a high level logic, thereby informing that there is no failure cell.

We note, that although FIG. 3 shows first to eighth exclusive NOR gates XNOR1 to XNOR8 that receive the 64-bit data transferred to the global data lines GIO<0:63> on the basis of 8 bits, the scope of the present invention is not limited to it.

Figure 4:
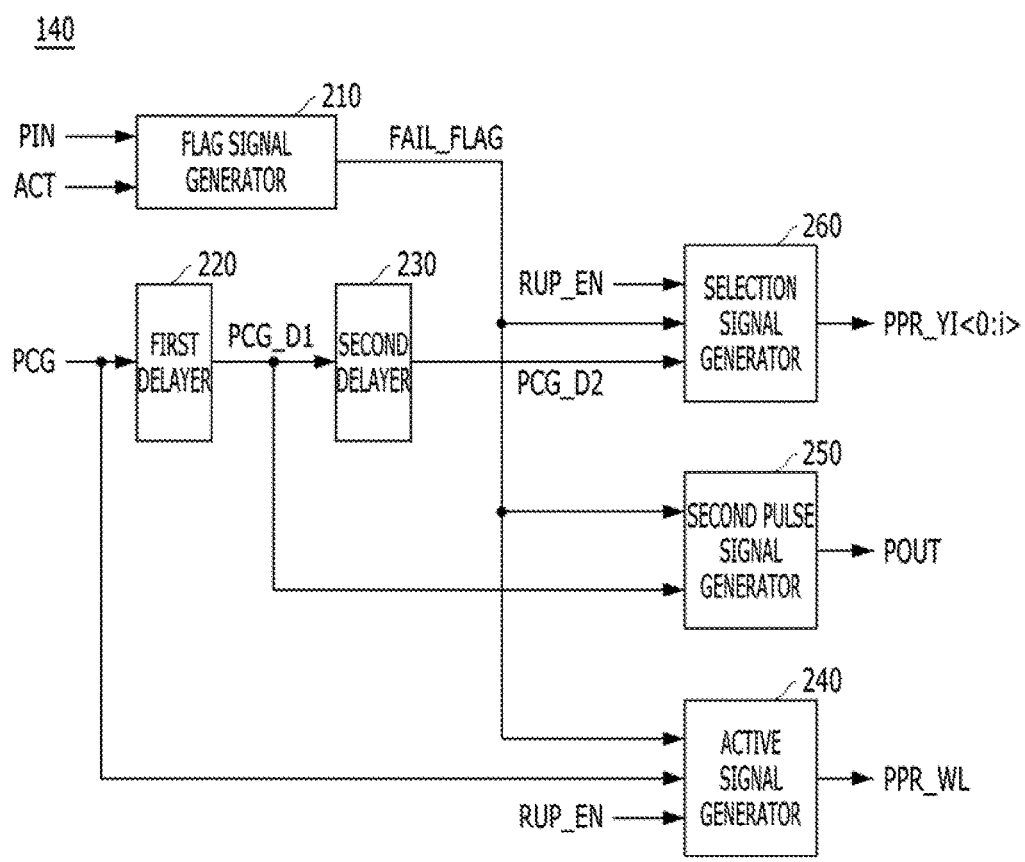
FIG. 4 is a block diagram illustrating an output control signal generation unit shown in FIG. 2.

FIG. 4 is a block diagram illustrating a configuration example of the output control signal generation unit 140 shown in FIG. 2.

Referring to FIG. 4, the output control signal generation unit 140 may include a flag signal generator 210, a first delayer 220, a second delayer 230, an active signal generator 240, a second pulse signal generator 250, and a selection signal generator 260.

The flag signal generator 210 may generate a failure flag signal FAIL_FLAG that is activated in response to the pulse-type input control signal PIN and deactivated in response to the active signal ACT. The first delayer 220 may generate a first delay signal PCG_D1 by delaying the pre-charge signal PCG for a predetermined time. The second delayer 230 may generate a second delay signal PCG_D2 by delaying the first delay signal PCG_D1 for a predetermined time.

The active signal generator 240 may generate the failure address word line active signal PPR_WL that is activated in a predetermined duration in response to the pre-charge signal PCG in an active duration of the failure flag signal FAIL_FLAG. Herein, the active duration of the failure address word line active signal PPR_WL may be decided according to the number of the word lines of the failure address storing region 112 that are simultaneously activated. For example, as the number of the word lines of the failure address storing region 112 that are simultaneously activated increases, the active duration of the failure address word line active signal PPR_WL becomes shorter. Also, the active signal generator 240 may generate the failure address word line active signal PPR_WL to be activated in an active duration of the rupture enable signal RUP_EN.

The second pulse signal generator 250 may generate the output control signal POUT that is activated in a pulse type in response to the first delay signal PCG_D1 in an active duration of the failure flag signal FAIL_FLAG.

The selection signal generator 260 may activate at least one of the failure address column selection signals PPR_YI<0:i> in response to the second delay signal PCG_D2 in the active duration of the failure flag signal FAIL_FLAG. Also, the selection signal generator 260 may sequentially activate the failure address column selection signals PPR_YI<0:i> in the active duration of the rupture enable signal RUP_EN.

Figure 5A:
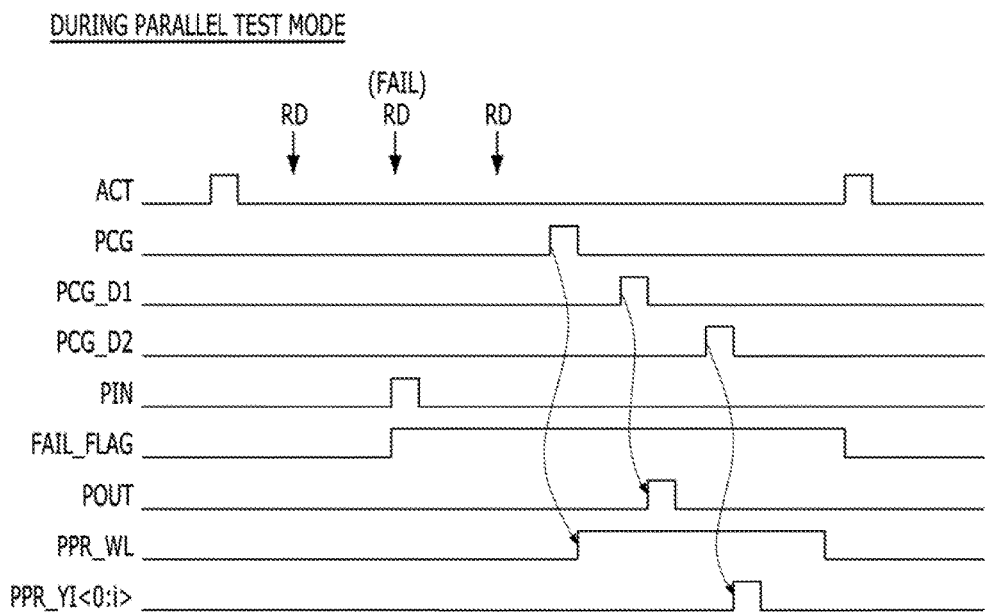
FIGS. 5A and 5B are waveform diagrams describing an operation of the output control signal generation unit shown in FIG. 4.
Figure 5B:
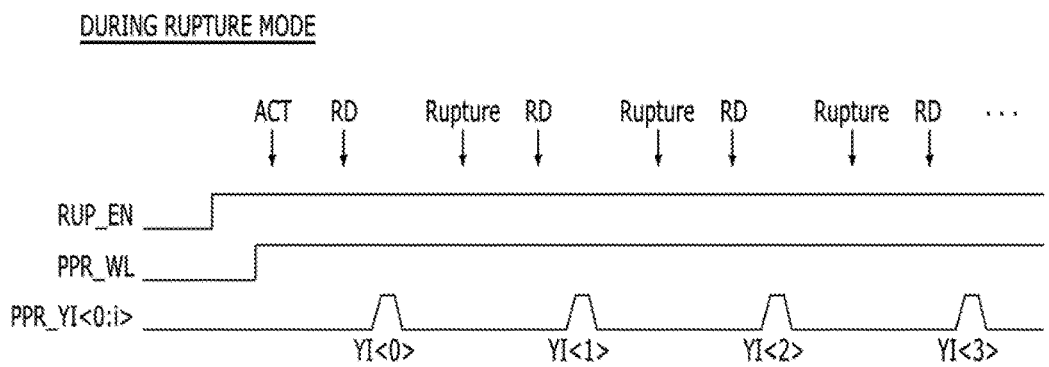

FIGS. 5A and 5B are waveform diagrams describing an operation of the output control signal generation unit 140 shown in FIG. 4.

FIG. 5A shows an operation of the output control signal generation unit 140 during the parallel test mode.

FIG. 5A shows a test operation in which the active signal ACT is inputted and then the read command RD is inputted three times and the pre-charge signal PCG is inputted during the parallel test mode. Herein, when a failure cell is detected in a read operation that is performed according to the second read command RD, the compression signal GIOSUMB is outputted in a low level logic, thereby informing whether that there is a failure cell. With the compression signal GIOSUMB outputted in the low level logic, the input control signal PIN is then activated in a pulse type.

The first delayer 220 of the output control signal generation unit 140 may generate the first delay signal PCG_D1 by delaying the pre-charge signal PCG for a predetermined time, and the second delayer 230 may generate the second delay signal PCG_D2 by delaying the first delay signal PCG_D1 for a predetermined time. The flag signal generator 210 may activate the failure flag signal FAIL_FLAG in response to the input control signal PIN and deactivate the failure flag signal FAIL_FLAG in response to the active signal ACT.

While the failure flag signal FAIL_FLAG is activated, the active signal generator 240 of the output control signal generation unit 140 may generate the failure address word line active signal PPR_WL that is activated in a predetermined duration in response to the pre-charge signal PCG, and the second pulse signal generator 250 may generate the output control signal POUT that is activated in a pulse type in response to the first delay signal PCG_D1, and the selection signal generator 260 may activate at least one of the failure address column selection signals PPR_YI<0:i> in response to the second delay signal PCG_D2. Herein, as the number of the word lines of the failure address storing region 112 that are simultaneously activated increases, the active duration of the failure address word line active signal PPR_WL becomes shorter. Therefore, the write operation where the failure address FRA<0:15> is stored in the failure address storing region 112 during the active-pre-charge time tRP may be secured.

1 Herein, the failure address latch unit 150 (see FIG. 2) may store the input address RA<1:16> as the failure address FRA<0:15> in response to the input control signal PIN that is activated in a pulse type, and output the stored failure address FRA<0:15> in response to the output control signal POUT that is activated in a pulse type.

FIG. 5B shows an operation of the output control signal generation unit 140 during the rupture mode.

Referring to FIG. 5B, during the rupture mode, in the active duration of the rupture enable signal RUP_EN, the active signal generator 240 may activate the failure address word line active signal PPR_WL and output the active failure address word line active signal PPR_WL, and the selection signal generator 260 may sequentially enable and output the failure address column selection signals PPR_YI<0:i>.

Accordingly, the rupture driving unit 170 (see FIG. 2) may transfer the failure address FRA<0:15> that is outputted from the failure address storing region 112 of the cell array region 110 through the global data lines GIO<0:63> to the non-volatile memory device 180, and the non-volatile memory device 180 (see FIG. 2) may receive and program the failure address FRA<0:15>.

Figure 6:
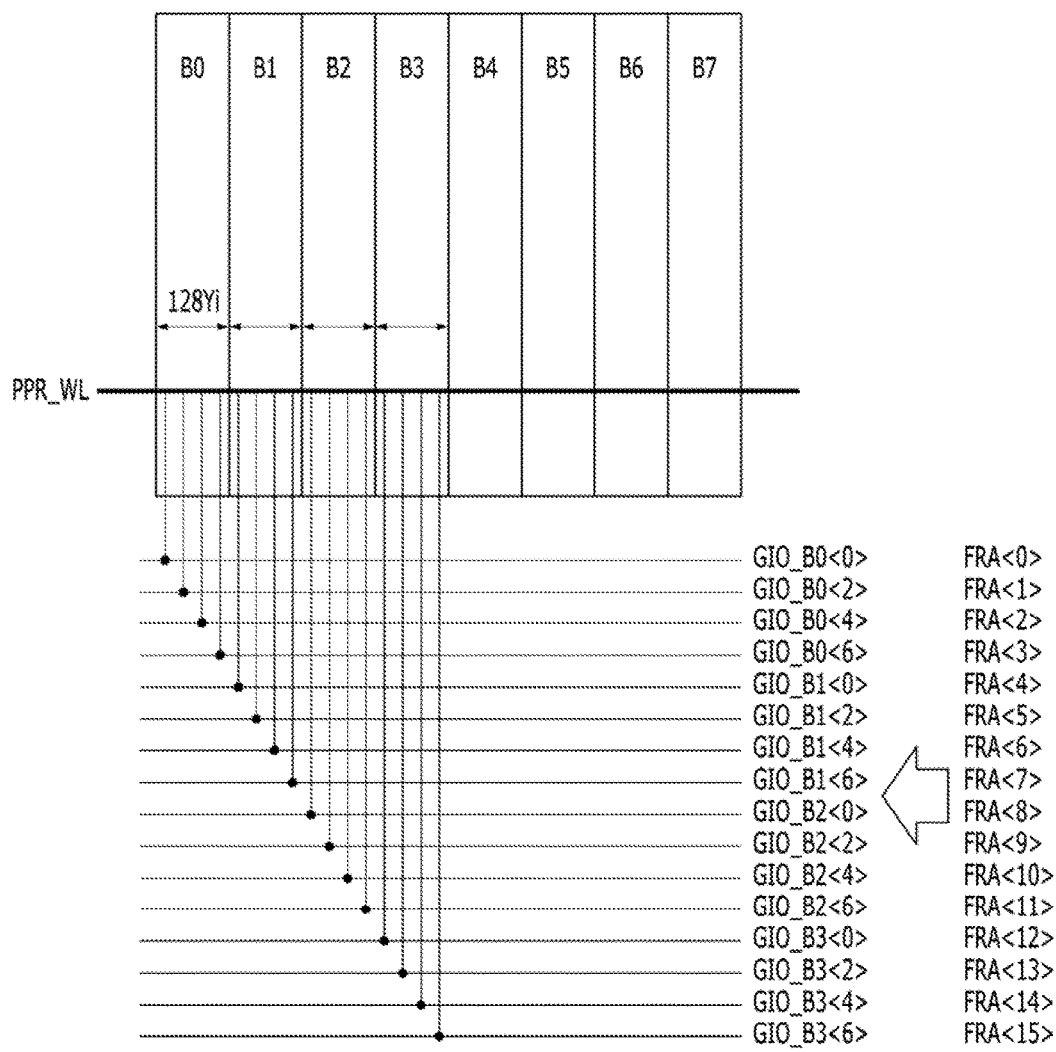
FIG. 6 illustrates a failure address mapping unit shown in FIG. 2.

FIG. 6 illustrates a configuration example of the failure address mapping unit 160 shown in FIG. 2.

Referring to FIG. 6, the failure address mapping unit 160 may map the 16 bits of the failure address FRA<0:15> received from the failure address latch unit 150 to some global data lines GIO_B0<0, 2, 4, 6>, GIO_B1<0, 2, 4, 6>, GIO_B2<0, 2, 4, 6> and GIO_B3<0, 2, 4, 6> of the global data lines GIO<0:63> that are allocated to predetermined banks, for example, the four banks B0 to B3 among the 8 banks B0 to B7 included in the cell array region 110 so that the failure address FRA<0:15> is stored in the failure address storing region 112 of the cell array region 110.

Therefore, the failure address word line active signal PPR_WL and a corresponding failure address column selection signal PPR_YI<0:i> are activated, the 16 bits of the failure address FRA<0:15> are transferred to the allocated global data lines GIO_B0<0, 2, 4, 6>, GIO_B1<0, 2, 4, 6>, GIO_B2<0, 2, 4, 6> and GIO_B3<0, 2, 4, 6> of the global data lines GIO<0:63> so that the failure address FRA<0:15> outputted from the failure address latch unit 150 is written in the memory cells of the failure address storing region 112.

Hereafter, an operation of the semiconductor memory device 100 shown in FIG. 2 is described with reference to FIGS. 2 to 7.

Figure 7:
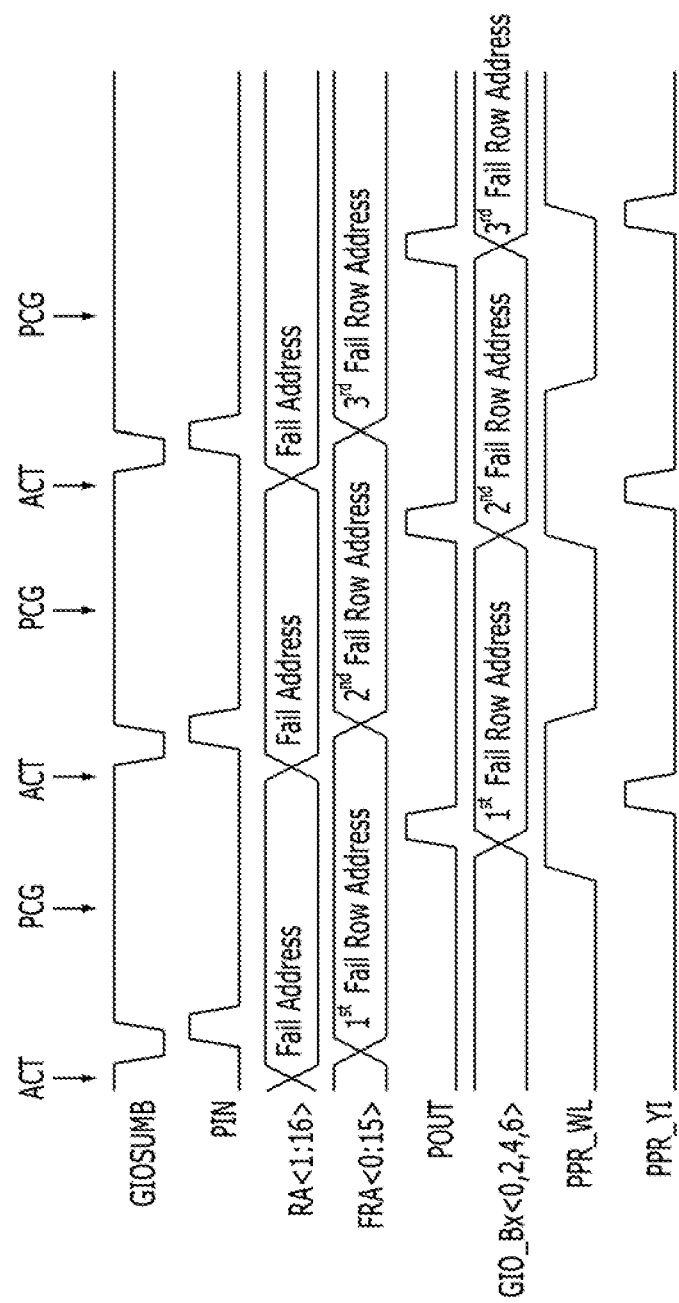
FIG. 7 is a waveform diagram describing an operation of the semiconductor memory device shown in FIG. 2 during a parallel test mode.

FIG. 7 is a waveform diagram describing an operation of the semiconductor memory device 100 shown in FIG. 2 during the parallel test mode.

Referring to FIG. 7, when a failure cell is detected in a read operation according to a read command RD during the parallel test mode, the input control signal generation unit 130 may output the compression signal GIOSUMB in a low level logic, thereby informing that there is a failure cell. With the compression signal GIOSUMB outputted in the low level logic, the pulse-type input control signal PIN may be activated.

The failure address latch unit 150 may store the input address RA<1:16> as the failure address FRA<0:15> in response to the input control signal PIN that is activated in the pulse type.

Subsequently, the output control signal generation unit 140 may generate the pulse-type output control signal POUT in response to the pre-charge signal PCG and the pulse-type input control signal PIN. The failure address latch unit 150 may output the stored failure address FRA<0:15> in response to the pulse-type output control signal POUT.

The failure address mapping unit 160 may map the bits of the failure address FRA<0:15> to global data lines that are allocated to predetermined banks among the multiple banks B0 to B7 included in the cell array region 110 so that the failure address FRA<0:15> is stored in the failure address storing region 112 of the cell array region 110. For example, the failure address mapping unit 160 may map the 16 bits of the failure address FRA<0:15> to some global data lines GIO_B0<0, 2, 4, 6>, GIO_B1<0, 2, 4, 6>, GIO_B2<0, 2, 4, 6> and GIO_B3<0, 2, 4, 6> of the global data lines GIO<0: 63> that are allocated to the upper four banks B0 to B3 among the 8 banks B0 to B7 included in the cell array region 110.

Meanwhile, before the generation of the output control signal POUT, the output control signal generation unit 140 may activate the failure address word line active signal PPR_WL first in response to the pre-charge signal PCG and the input control signal PIN. Also, after the output control signal POUT is generated, the output control signal generation unit 140 may activate at least one of the failure address column selection signals PPR_YI<0:i>. Since this operation is already described earlier with reference to FIG. 5A, further description is not provided herein.

Therefore, during the parallel test mode, the failure address FRA<0:15> that is outputted from the failure address latch unit 150 in response to the failure address word line active signal PPR_WL and the activated failure address column selection signal PPR_YI may be mapped to a global data line and written in the memory cells of the failure address storing region 112.

In an embodiment of the present invention, the semiconductor memory device 100 is provided including the cell array region 110 to store and output data selected based on the input address RA<1:16>, the failure address latch unit 150 and the non-volatile memory device 180 coupled to the cell array region 110. The cell array region 110 may include the failure address storing region 112 to store the failure address FRA<0:15>. The failure address storing region 112 of the cell array region 110 may be disposed adjacent to the failure address latch unit 150. In a parallel test mode, the compression signal GIOSUMB may be generated indicating that there is at least one failure cell by reading the data received from a second region adjacent to the failure address storing region 112 of the cell array region 110 through the global data lines GIO<0:63> in response to a read command, and then an input control signal PIN based on the compression signal GIOSUMB may be generated. The input address RA<1:16> as the failure address FRA<0:15> in response to the input control signal PIN may be stored in the failure address latch unit 150. The failure address FRA<0:15> to the global data lines GIO<0:63> to store the failure address FRA<0:15> in the failure address storing region 112 of the cell array region 110 may be mapped by the failure address mapping unit 160. In a rupture mode, the rupture driving unit 170 may transfer the failure address FRA<0:15> that is received from the failure address storing region 112 of the cell array region 110 through the global data lines GIO<0: 63> to the non-volatile memory device 180, and the non-volatile memory device 180 may receive and program the failure address FRA<0:15>.

The above embodiment of the present invention describes a structure for storing the input address RA<1:16> as the failure address FRA<0:15> by using the compression signal GIOSUMB informing whether or not there is a failure cell and outputs the stored failure address FRA<0:15> based on the pre-charge signal PCG during the parallel test mode.

In the following embodiment of the present invention, a semiconductor memory device that is capable of repairing failure cells that are detected after the semiconductor memory device is packaged and mounted on an actual product, and a method of operating the semiconductor memory device are described. Herein, description on the structures of FIG. 8 that are substantially the same as those of FIG. 2 is omitted.

Figure 8:
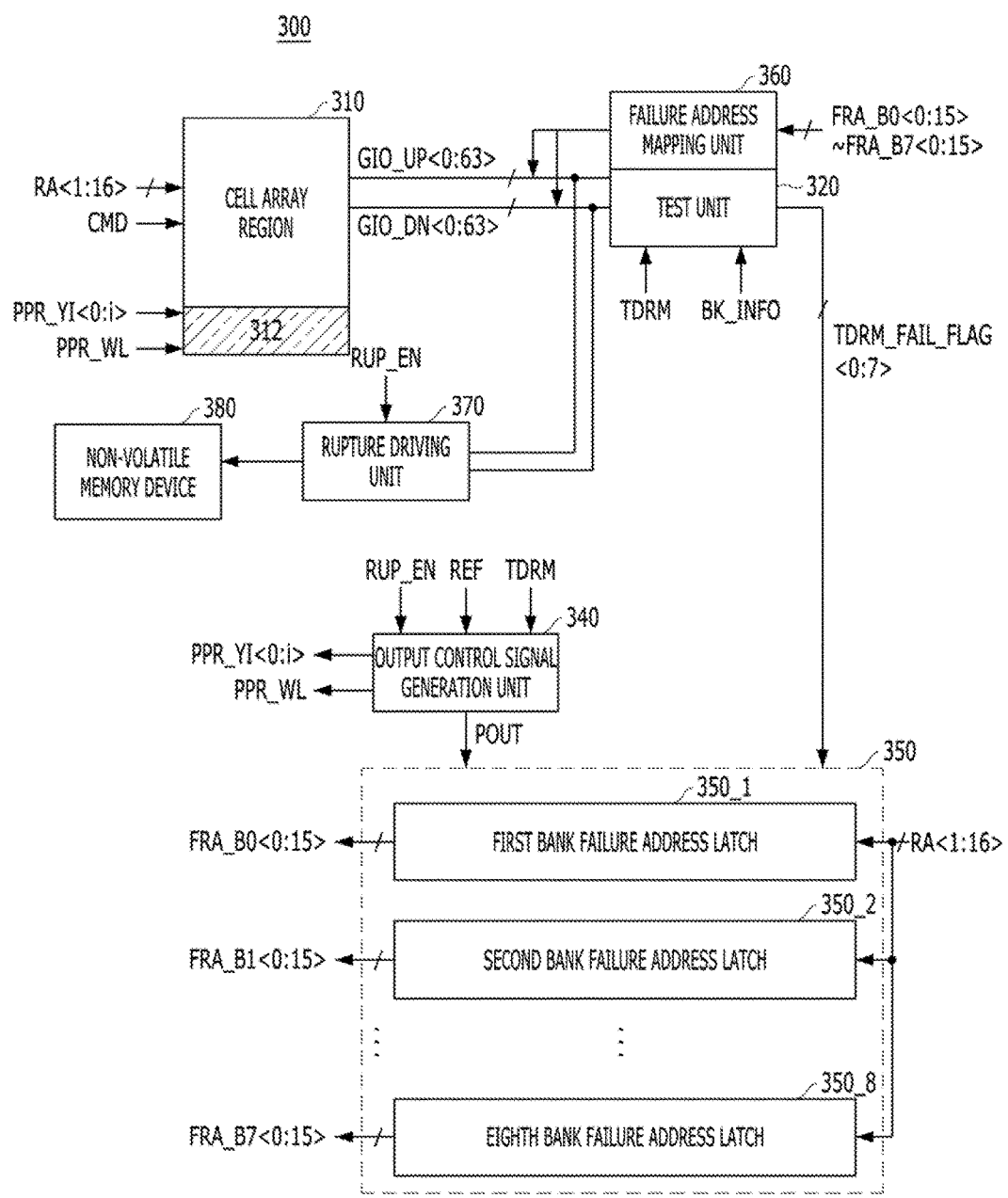
FIG. 8 is a block diagram illustrating a semiconductor memory device, in accordance with another embodiment of the present invention.

FIG. 8 is a block diagram illustrating a semiconductor memory device 300 in accordance with another embodiment of the present invention. The semiconductor memory device 300 may include a cell array region 310 having, for example, 8 banks B0 to B7 (not shown), 64 first global data lines GIO_UP<0:63> and 64 second global data lines GIO_DN<0:63> that connect the banks B0 to B7 to external structures.

FIG. 8 shows a structure for storing an input address RA<1:16> as bank failure addresses FRA_B0<0:15> to FRA_B7<0:15>, and outputting the stored bank failure addresses FRA_B0<0:15> to FR_B7<0:15> in response to a refresh signal REF in an application test (AT) mode that is performed by mounting the semiconductor memory device 300 on an actual product.

The semiconductor memory device 300 may include besides the cell array region 310, a test unit 320, an output control signal generation unit 340, a failure address latch unit 350, a failure address mapping unit 360, a rupture driving unit 370, and a non-volatile memory device 380.

The cell array region 310 may include memory cells that store data, and store and output data in and out of the memory cells that are selected based on a command CMD and an input address RA<1:16>. A portion of the cell array region 310 may be allocated as a failure address storing region 312 for storing a failure address FRA<0:15> for each bank. Since the cell array region 310 shown in FIG. 8 has substantially the same structure as the cell array region 110 shown in FIG. 2, further description of it is omitted herein.

The test unit 320 may compare the data received from the banks B0 to B7 of the cell array region 310 through first global data lines GIO_UP<0:63> and second global data lines GIO_DN<0:63> in response to a read command RD during the test mode, and generate first to eighth failure flag signals TDRM_FAIL_FLAG<0:7> that inform whether or not there is a failure cell. The test unit 320 may generate bank information BK_INFO that informs from which bank the data outputted through the first global data lines GIO_UP<0:63> and the second global data lines GIO_DN<0:63> are outputted, and generate the first to eighth failure flag signals TDRM_FAIL_FLAG<0:7> that inform whether or not there is a failure cell for each bank upon receipt of a test mode signal TDRM that informs the beginning of the application test mode.

Herein, the test mode signal TDRM is a signal for simultaneously activating more than two word lines in order to detect a failure row during the application test mode. For example, when the test mode signal TDRM is activated, more than two word lines are activated and the banks of the activated word lines output data through the first global data lines GIO_UP<0:63> and the second global data lines GIO_DN<0:63>. The test unit 320 then may compare the bits of the data that are transferred through the first global data lines GIO_UP<0:63> and the second global data lines GIO_DN<0:63> and generate the first to eighth failure flag signals TDRM_FAIL_FLAG<0:7> that informs whether or not there is a failure cell. For example, when two word lines WL1 and WL2 of the first bank B0 are selected based on the test mode signal TDRM, the bits of the data transferred from one word line, i.e., the word line WL1, through the first global data lines GIO_UP<0:63> and the bits of the data transferred from the other word line, i.e., the word line WL2, through the second global data lines GIO_DN<0:63> are compared with each other. Then, when there is a difference in the two data, the first failure flag signal TDRM_FAIL_FLAG<0> may be enabled and outputted.

The output control signal generation unit 340 may generate an output control signal POUT that is activated in a pulse type in response to the refresh signal REF.

The failure address latch unit 350 may include first to eighth bank failure address latches 350_1 to 350_8 that respectively correspond to the 8 banks B0 to B7. The first to eighth bank failure address latches 350_1 to 350_8 may store the input address RA<1:16> as the corresponding bank failure addresses FRA_B0<0:15> to FRA_B7<0:15> in response to the corresponding bank failure flag signals TDRM_FAIL_FLAG<0:7>, and simultaneously output the stored bank failure addresses FRA_B0<0:15> to FRA_B7<0:15> in response to the output control signal POUT.

The failure address mapping unit 360 may map the bits of the bank failure addresses FRA_B0<0:15> to FRA_B7<0:15> that are received from the failure address latch unit 350 to the first global data lines GIO_UP<0:63> and the second global data lines GIO_DN<0:63> so that the bank failure addresses FRA_B0<0:15> to FRA_B7<0:15> are stored in the failure address storing region 312 of the cell array region 310. According to an embodiment of the present invention, the failure address mapping unit 360 may map the bits of the bank failure addresses FRA_B0<0:15> to FRA_B7<0:15> to global data lines allocated to a predetermined bank among a plurality of banks included in the cell array region 310. For example, the failure address mapping unit 360 may map the 128 bits of the bank failure addresses FRA_B0<0:15> to FRA_B7<0:15> to the first global data lines GIO_UP<0:63> and the second global data lines GIO_DN<0:63>. However, this is a mere example and the mapping operation of the failure address mapping unit 360 may be realized diversely in accordance with diverse embodiments of the present invention.

Since the rupture driving unit 370 and the non-volatile memory device 380 shown in FIG. 8 have substantially the same structures shown in FIG. 2, further description of them are omitted herein.

Meanwhile, the output control signal generation unit 340 may further generate a failure address word line active signal PPR_WL and a plurality of failure address column selection signals PPR_YI<0:i> for driving the memory cells of the failure address storing region 312.

According to another embodiment of the present invention, during the application test mode, the output control signal generation unit 340 may activate the failure address word line active signal PPR_WL and at least one among the plurality of the failure address column selection signals PPR_YI<0:i> in response to the refresh signal REF in a duration where the test mode signal TDRM is activated. Therefore, during the application test mode, the bank failure addresses FRA_B0<0:15> to FRA_B7<0:15> that are outputted from the failure address latch unit 350 in response to the failure address word line active signal PPR_WL and the activated failure address column selection signal PPR_YI may be written in the memory cells of the failure address storing region 312. Also, the output control signal generation unit 340 may activate the failure address word line active signal PPR_WL and sequentially activate the plurality of the failure address column selection signals PPR_YI<0:i> in a duration where a rupture enable signal RUP_EN is activated during a rupture mode. Therefore, during the rupture mode, the bank failure addresses FRA_B0<0:15> to FRA_B7<0:15> that are stored in the memory cells of the failure address storing region 312 may be sequentially programmed in the non-volatile memory device 380 through the rupture driving unit 370.

In accordance with yet another embodiment of the present invention, when a failure cell is detected during the application test mode, the failure address of the detected failure cell is stored in the failure address latch unit, and the failure address stored in the failure address latch unit is stored in some memory cells of the cell array region in response to the refresh signal. Also, the failure address stored during the rupture mode is programmed in the non-volatile memory device, and then the failure cell that is detected after the packaging stage is repaired. In short, a post-package repair operation is performed. In this way, the yield may be improved while the time taken for the test may be reduced.

Figure 9:
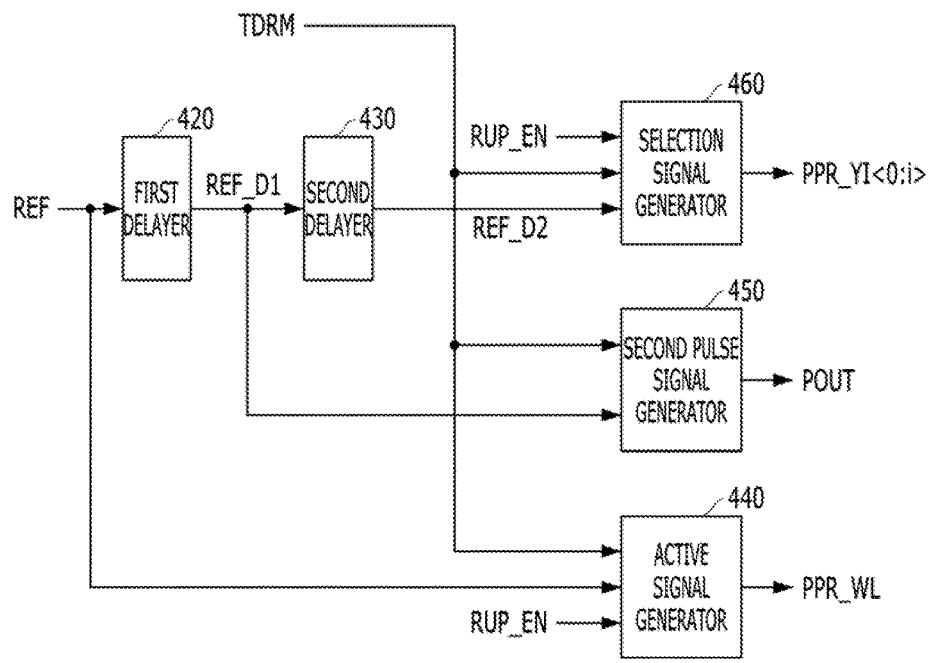
FIG. 9 is a block diagram illustrating an output control signal generation unit shown in FIG. 8.

FIG. 9 is a block diagram illustrating a configuration example of the output control signal generation unit shown in FIG. 8.

Referring to FIG. 9, the output control signal generation unit 340 may include a first delayer 420, a second delayer 430, an active signal generator 440, a pulse signal generator 450, and a selection signal generator 460.

The first delayer 420 may generate a first delay signal REF_D1 by delaying the refresh signal REF for a predetermined time. The second delayer 430 may generate a second delay signal REF_D2 by delaying the first delay signal REF_D1 for a predetermined time.

The active signal generator 440 may generate the failure address word line active signal PPR_WL that is activated in a predetermined duration in response to the refresh signal REF in an active duration of the test mode signal TDRM. Herein, the active duration of the failure address word line active signal PPR_WL may be decided according to the number of the word lines of the failure address storing region 312 that are simultaneously activated. For example, as the number of the word lines of the failure address storing region 312 that are simultaneously activated increases, the active duration of the failure address word line active signal PPR_WL becomes shorter. Also, the active signal generator 440 may generate the failure address word line active signal PPR_WL to be activated in an active duration of the rupture enable signal RUP_EN.

The pulse signal generator 450 may generate the output control signal POUT that is activated in a pulse type in response to the first delay signal REF_D1 in an active duration of the test mode signal TDRM.

The selection signal generator 460 may activate at least one of the failure address column selection signals PPR_YI<0:i> in response to the second delay signal REF_D2 in the active duration of the test mode signal TDRM. Also, the selection signal generator 460 may sequentially activate the failure address column selection signals PPR_YI<0:i> in the active duration of the rupture enable signal RUP_EN.

Figure 10:
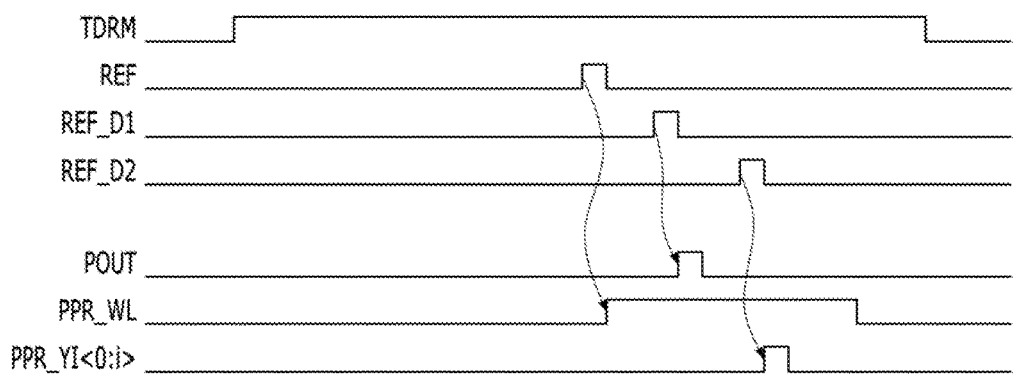
FIG. 10 is a waveform diagram describing an operation of the output control signal generation unit shown in FIG. 9.

FIG. 10 is a waveform diagram describing an operation of the output control signal generation unit 340 shown in FIG. 9.

FIG. 10 shows an operation of the output control signal generation unit 340 during the application test mode.

Referring to FIG. 10, during the application test mode, the first delayer 420 of the output control signal generation unit 340 may generate the first delay signal REF_D1 by delaying the refresh signal REF for a predetermined time, and the second delayer 430 may generate the second delay signal REF_D2 by delaying the first delay signal REF_D1 for a predetermined time.

While the test mode signal TDRM is activated, the active signal generator 440 of the output control signal generation unit 340 may generate the failure address word line active signal PPR_WL that is activated in response to the refresh signal REF in a predetermined duration, and the pulse signal generator 450 may generate the output control signal POUT that is activated in a pulse type in response to the first delay signal REF_D1, and the selection signal generator 460 may activate at least one of the failure address column selection signals PPR_YI<0:i> in response to the second delay signal REF_D2. Herein, as the number of the word lines of the failure address storing region 312 that are simultaneously activated increases, the active duration of the failure address word line active signal PPR_WL becomes shorter. Therefore, the write operation where the failure address FRA<0:15> is stored in the failure address storing region 312 during the active-pre-charge time tRP may be secured.

Herein, the first to eighth bank failure address latches 350_1 to 350_8 of the failure address latch unit 350 (see FIG. 8) may store the input address RA<1:16> as the bank failure addresses FRA_B0<0:15> to FRA_B7<0:15> in response to the corresponding bank failure flag signals TDRM_FAIL_FLAG<0:7>, and output the stored bank failure addresses FRA_B0<0:15> to FRA_B7<0:15> in response to the output control signal POUT.

Figure 11:
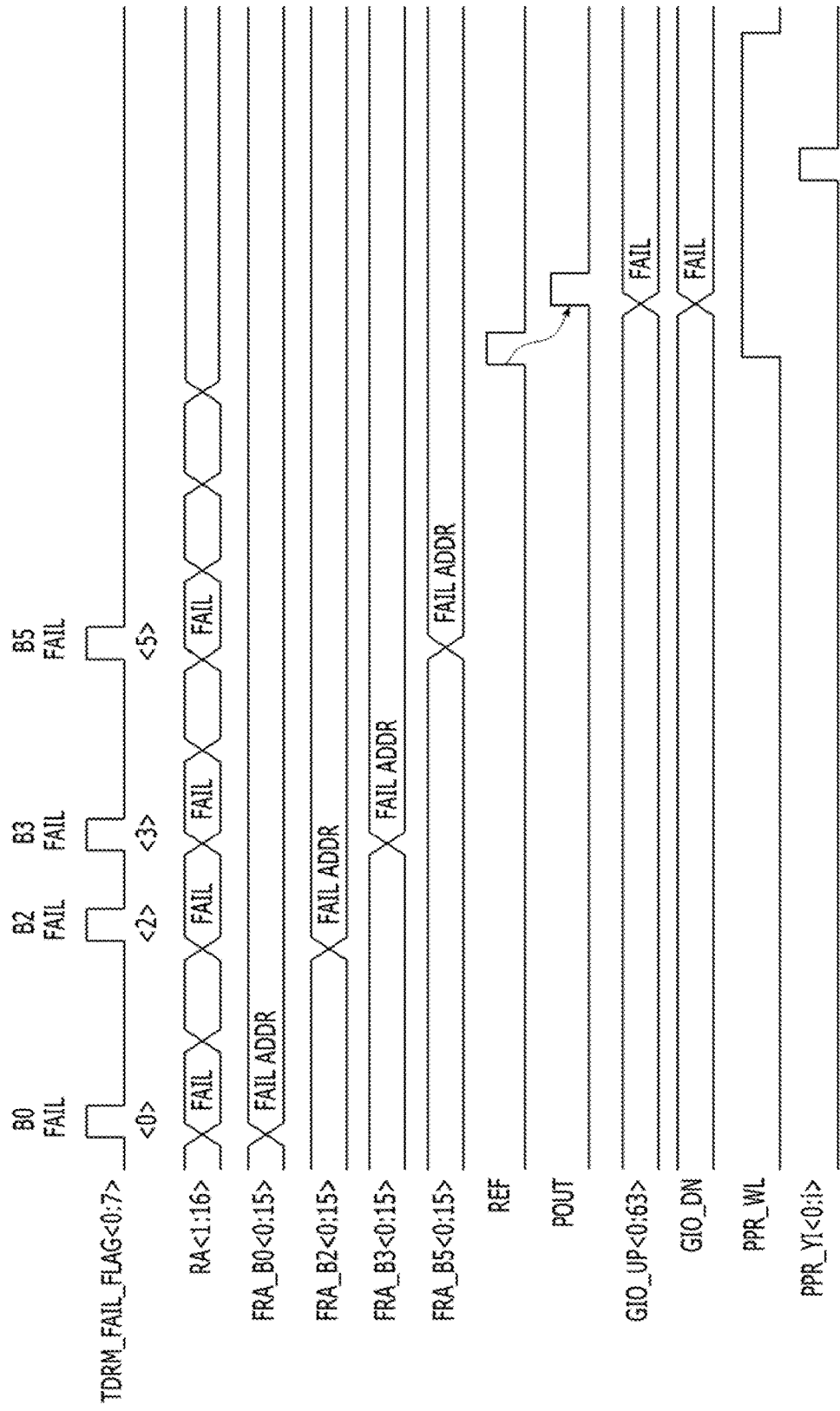
FIG. 11 is a waveform diagram describing an operation of the semiconductor memory device shown in FIG. 8 during an application test mode.

FIG. 11 is a waveform diagram describing an operation of the semiconductor memory device 300 shown in FIG. 8 during the application test mode.

Referring to FIG. 11, during the application test mode, the test unit 320 may compare the data received from the banks B0 to B7 of the cell array region 310 through the first global data lines GIO_UP<0:63> and the second global data lines GIO_DN<0:63> during the application test mode, and generate the first to eighth failure flag signals TDRM_FAIL_FLAG<0:7> that inform whether or not there is a failure cell. For example, FIG. 11 shows a case where there are failure cells in the first bank B0, the third bank B2, the fourth bank B3, and the sixth bank B5, and thus, the first, third, fourth and sixth bank failure flag signals TDRM_FAIL_FLAG<0, 2, 3, 5> are activated.

The failure address latch unit 350 may include the first to eighth bank failure address latches 350_1 to 350_8. The first to eighth bank failure address latches 350_1 to 350_8 may store the input address RA<1:16> as the corresponding bank failure addresses FRA_B0<0:15> to FRA_B7<0:15> whenever the corresponding bank failure flag signals TDRM_FAIL_FLAG<0:7> are activated.

The output control signal generation unit 340 may generate the output control signal POUT that is activated in a pulse type in response to the refresh signal REF. The first to eighth bank failure address latches 350_1 to 350_8 of the failure address latch unit 350 may output the stored bank failure addresses FRA_B0<0:15> to FRA_B7<0:15> in response to the output control signal POUT.

The failure address mapping unit 360 may map the bits of the bank failure addresses FRA_B0<0:15> to FRA_B7<0:15> to the first global data lines GIO_UP<0:63> and the second global data lines GIO_DN<0:63> so that the bank failure addresses FRA_B0<0:15> to FRA_B7<0:15> are stored in the failure address storing region 312 of the cell array region 310.

Meanwhile, before the generation of the output control signal POUT, the output control signal generation unit 340 may activate the failure address word line active signal PPR_WL first in response to the refresh signal REF. Also, after the output control signal POUT is generated, the output control signal generation unit 340 may activate at least one among the plurality of the failure address column selection signals PPR_YI<0:i>. Since the operations related to them are described earlier with reference to FIG. 5A, further description of them is omitted herein.

Therefore, in the application test mode, the bank failure addresses FRA_B0<0:15> to FRA_B7<0:15> that are outputted from the failure address latch unit 350 in response to the failure address word line active signal PPR_WL and the activated failure address column selection signal PPR_YI may be mapped to global data lines to be written in the memory cells of the failure address storing region 312.

According to an embodiment of the present invention, a semiconductor memory device is capable of storing a failure address that occurs during a test performed after a packaging stage in some memory cells in a cell array region by using a pre-charge signal or a refresh signal, and repairing the failure address that occurs after the packaging stage by using the stored failure address. In this way, the yield may be improved while reducing the time taken for the test.

Also, according to an embodiment of the present invention, a semiconductor memory device may repair the tail part of a refresh characteristics graph in which the refresh characteristics appear poor during a module test. Therefore, it is possible to reduce the amount of current that is consumed for refresh operations which is frequently performed to improve the data retention characteristics.

While the present invention has been described with respect to the specific embodiments, it will be apparent to those skilled in the art that various changes and modifications may be made without departing from the spirit and scope of the invention as defined in the following claims.

For example, the logic gates and transistors illustrated in the embodiments of the present invention described above may be realized differently in their positions and kinds according to the polarity of an input signal.

What is claimed is:

1. A semiconductor memory device comprising:
   a cell array region suitable for storing and outputting a data selected based on an input address, the cell array region including a first cell region suitable for storing a failure address;
   an input control signal generation unit suitable for generating a compression signal informing whether or not there is a failure cell by reading the data which is received from the cell array region through a data line in response to a read command during a parallel test mode, and for generating an input control signal based on the generated compression signal;

an output control signal generation unit suitable for generating an output control signal in response to the input control signal and a pre-charge signal;

a failure address latch unit suitable for storing the input address as the failure address in response to the input control signal, and for outputting the stored failure address in response to the output control signal;

a failure address mapping unit suitable for mapping the failure address to the data line to store the failure address in the first cell region of the cell array region; and a non-volatile memory device suitable for receiving the failure address from the first cell region and for programming the failure address in a rupture mode.

2. The semiconductor memory device of claim 1, wherein the cell array region includes a memory cell region for a normal operation, and during the parallel test mode, an active operation of a first word line for driving memory cells of the first cell region is performed while a pre-charge operation is performed on a second word line for driving the memory cells of the cell array region.

3. The semiconductor memory device of claim 1, wherein the output control signal generation unit further generates a word line active signal and a plurality of column selection signals for driving memory cells of the first cell region.

4. The semiconductor memory device of claim 3, wherein the output control signal generation unit activates the word line active signal and at least one among the plurality of the column selection signals in response to the pre-charge signal and the input control signal during the parallel test mode, and the output control signal generation unit activates the word line active signal and sequentially activates the plurality of the column selection signals during the rupture mode.

5. The semiconductor memory device of claim 3, wherein more than two word lines of the first cell region are activated in response to the word line active signal.

6. The semiconductor memory device of claim 3, wherein the output control signal generation unit includes:

a first delayer suitable for generating a first delay signal by delaying the pre-charge signal for a first predetermined time;

a second delayer suitable for generating a second delay signal by delaying the first delay signal for a second predetermined time;

a flag signal generator suitable for generating a failure flag signal which is activated in response to the input control signal and deactivated in response to an active signal;

an active signal generator suitable for generating the word line active signal activated in a predetermined duration in response to the pre-charge signal in an active duration of the failure flag signal, and activated in an active duration of a rupture enable signal;

a pulse signal generator suitable for generating the output control signal which is activated in response to the first delay signal in the active duration of the failure flag signal; and a selection signal generator suitable for activating at least one of the plurality of the column selection signals in response to the second delay signal in the active duration of the failure flag signal, and for sequentially activating the plurality of the column selection signals in the active duration of the rupture enable signal.

7. The semiconductor memory device of claim 6, wherein an active duration of the word line active signal is decided based on the number of word lines in the first cell region that are activated in response to the word line active signal.

8. The semiconductor memory device of claim 1, wherein the input control signal generation unit includes:

a data compressor suitable for generating the compression signal by compressing the data outputted through the data line during the parallel test mode; and a pulse signal generator suitable for generating the input control signal in a pulse form based on the compression signal.

9. The semiconductor memory device of claim 1, wherein the failure address mapping unit maps bits of the failure address to a data line allocated to a predetermined bank among a plurality of banks included in the cell array region.

10. The semiconductor memory device of claim 1, further comprising:

a rupture diving unit suitable for transferring the failure address received from the first cell region of the cell array region through the data line to the non-volatile memory device in the rupture mode.

11. A semiconductor memory device comprising:

a cell array region including a plurality of banks suitable for storing and outputting data selected based on an input address, and a first cell region suitable for storing bank failure addresses;

a test unit suitable for comparing, in a test mode, the data received from the plurality of the banks through a first data line and the data received from the plurality of the banks through a second data line in response to a read command, and for generating a plurality of bank failure flag signals informing whether or not there is a failure cell;

an output control signal generation unit suitable for generating an output control signal in response to a refresh signal;

a failure address latch unit suitable for storing the input address as the bank failure addresses in response to the plurality of the bank failure flag signals, and for outputting the stored bank failure addresses in response to the output control signal;

a failure address mapping unit suitable for mapping the bank failure addresses to the first and second data lines to store the bank failure addresses in the first cell region of the cell array region; and a non-volatile memory device suitable for receiving and programming the bank failure addresses from the first cell region in a rupture mode.

12. The semiconductor memory device of claim 11, wherein the test mode is an application test (AT) mode performed by mounting the semiconductor memory device on a product.

13. The semiconductor memory device of claim 11, wherein the failure address latch unit includes:

a plurality of bank failure address latches corresponding to the plurality of the bank failure flag signals, the plurality of the bank failure address latches being suitable for storing the input address as the bank failure addresses in response to the corresponding plurality of the bank failure flag signals, and for simultaneously outputting the stored bank failure addresses in response to the output control signal, respectively.

14. The semiconductor memory device of claim 11, wherein the output control signal generation unit further generates
a word line active signal and a plurality of column selection signals for driving memory cells of the first cell region.

15. The semiconductor memory device of claim 14, wherein the output control signal generation unit activates the word line active signal and at least one among the plurality of the column selection signals in response to the refresh signal during the test mode, and
the output control signal generation unit activates the word line active signal and sequentially activates the plurality of the column selection signals during the rupture mode.

16. The semiconductor memory device of claim 14, wherein the output control signal generation unit includes:
a first delayer suitable for generating a first delay signal by delaying the refresh signal for a first predetermined time;
a second delayer suitable for generating a second delay signal by delaying the first delay signal for a second predetermined time;
a flag signal generator suitable for generating a failure flag signal which is activated in response to the input control signal and deactivated in response to an active signal;
an active signal generator suitable for generating the word line active signal which is activated in a predetermined duration in response to the refresh signal in an active duration of a test mode signal, and activated in an active duration of a rupture enable signal;
a pulse signal generator suitable for generating the output control signal which is activated in response to the first delay signal in the active duration of the test mode signal; and
a selection signal generator suitable for activating at least one among the plurality of the column selection signals in response to the second delay signal in the active duration of the test mode signal, and for sequentially activating the plurality of the column selection signals in the active duration of the rupture enable signal.

17. The semiconductor memory device of claim 11, wherein the failure address mapping unit maps bits of the failure address latch unit to the first data line and the second data line.

18. A method of operating a semiconductor memory device, comprising:
providing a memory device including a volatile memory cell array to store and output data selected based on an input address, a latch unit and a non-volatile memory device coupled to the volatile memory cell array, wherein the volatile memory cell array includes a first region to store a failure address;
in a parallel test mode, generating a compression signal to indicate that there is at least one failure cell by reading the data received from the volatile memory cell array through a data line in response to a read command, and generating an input control signal based on the compression signal;
storing the input address as the failure address in the latch unit in response to the input control signal;
mapping the failure address to the data line to store the failure address in the first region of the volatile memory cell array; and
in a rupture mode, receiving the failure address from the first region of the volatile memory cell array and programming the failure address to the non-volatile memory device.

19. The method of claim 18, wherein the first region of the volatile memory cell array is disposed with adjacent to the latch unit.

20. The method of claim 18, wherein the volatile memory cell array includes a second region for a normal operation, and
when a pre-charge operation is performed on a word line for driving memory cells of the second region, an active operation is performed on a word line for driving memory cells of the first cell region, during the parallel test mode.

* * * * *